US010401412B2

(12) United States Patent
Rajagopal et al.

(10) Patent No.: US 10,401,412 B2
(45) Date of Patent: Sep. 3, 2019

(54) LINE FAULT SIGNATURE ANALYSIS

(71) Applicant: Texas Instruments Incorporated, Dallas, TX (US)

(72) Inventors: Prasanna U Rajagopal, Dallas, TX (US); Kallikuppa M Sreenivasa, Bangalore (IN); Amit G Kumbasi, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 67 days.

(21) Appl. No.: 15/844,235

(22) Filed: Dec. 15, 2017

(65) Prior Publication Data
US 2018/0172750 A1 Jun. 21, 2018

Related U.S. Application Data

(60) Provisional application No. 62/435,621, filed on Dec. 16, 2016.

(51) Int. Cl.
*G01R 19/25* (2006.01)
*G01R 31/02* (2006.01)
*G01R 31/26* (2014.01)

(52) U.S. Cl.
CPC ....... *G01R 31/022* (2013.01); *G01R 19/2513* (2013.01); *G01R 31/024* (2013.01); *G01R 31/2612* (2013.01)

(58) Field of Classification Search
CPC ............... G01R 31/022; G01R 31/024; G01R 31/2612; G01R 19/2513
See application file for complete search history.

(56) References Cited

U.S. PATENT DOCUMENTS

| 5,485,093 | A | * | 1/1996 | Russell | ............... G01R 31/025 |
| | | | | | 324/522 |
| 5,734,575 | A | | 3/1998 | Snow et al. | |
| 5,784,585 | A | | 7/1998 | Denman | |
| 5,822,606 | A | | 10/1998 | Morton | |
| 5,835,392 | A | | 11/1998 | Dulong et al. | |

(Continued)

OTHER PUBLICATIONS

MSP Low-Power Microcontrollers, Texas Instruments, www.ti.com/msp, 2015, 41 pgs.

(Continued)

*Primary Examiner* — David M. Gray
*Assistant Examiner* — Michael A Harrison
(74) *Attorney, Agent, or Firm* — Brian D. Graham; Charles A. Brill; Frank D. Cimino

(57) ABSTRACT

In described examples, a time-domain analyzer is arranged to generate an indication of a number of high-frequency events of an electrical monitor signal that includes a fundamental periodic frequency. The high-frequency events include frequencies higher than the fundamental periodic frequency. A frequency-domain analyzer is arranged to generate frequency band information in response to frequencies of the electrical monitor signal that are higher than the fundamental periodic frequency. A fault detector is arranged to monitor the indication of the number of high-frequency events and the generated frequency band information, and to generate a fault flag in response to the monitored indication of the number of high-frequency events and the generated frequency band information.

20 Claims, 7 Drawing Sheets

(56) References Cited

U.S. PATENT DOCUMENTS

| | | | |
|---|---|---|---|
| 5,896,305 | A | 4/1999 | Bosshart et al. |
| 5,903,155 | A | 5/1999 | Björklund |
| 5,920,497 | A | 7/1999 | Rim |
| 5,961,575 | A | 10/1999 | Hervin et al. |
| 5,978,838 | A | 11/1999 | Mohamed et al. |
| 5,983,256 | A | 11/1999 | Peleg et al. |
| 6,014,684 | A | 1/2000 | Hoffman |
| 6,233,597 | B1 | 5/2001 | Tanoue et al. |
| 6,317,820 | B1 | 11/2001 | Shiell et al. |
| 6,574,724 | B1 | 6/2003 | Hoyle et al. |
| 7,062,526 | B1 | 6/2006 | Hoyle |
| 7,236,338 | B2 | 6/2007 | Hale et al. |
| 7,281,117 | B2 | 10/2007 | Tanaka et al. |
| 7,386,326 | B2 | 6/2008 | Sundararajan et al. |
| 7,587,577 | B2 | 9/2009 | Royer et al. |
| 7,681,013 | B1 | 3/2010 | Trivedi et al. |
| 7,937,559 | B1 | 5/2011 | Parameswar et al. |
| 8,065,506 | B2 | 11/2011 | Xi et al. |
| 2001/0037352 | A1 | 11/2001 | Hong |
| 2002/0198911 | A1 | 12/2002 | Blomgren et al. |
| 2003/0196072 | A1 | 10/2003 | Chinnakonda et al. |
| 2005/0005180 | A1 | 1/2005 | Webster |
| 2005/0144215 | A1 | 6/2005 | Simkins et al. |
| 2005/0251644 | A1 | 11/2005 | Maher et al. |
| 2008/0071848 | A1 | 3/2008 | Baireddy et al. |
| 2008/0133627 | A1 | 6/2008 | Langhammer et al. |
| 2008/0141012 | A1 | 6/2008 | Yehia et al. |
| 2008/0263285 | A1 | 10/2008 | Sharma et al. |
| 2009/0019262 | A1 | 1/2009 | Tashiro et al. |
| 2009/0063820 | A1 | 3/2009 | Xi et al. |
| 2009/0150654 | A1 | 6/2009 | Oberman et al. |
| 2009/0265409 | A1 | 10/2009 | Peleg et al. |
| 2010/0191979 | A1 | 7/2010 | Zipperer et al. |
| 2010/0211761 | A1 | 8/2010 | Dasgupta |
| 2010/0306292 | A1 | 12/2010 | Catherwood et al. |
| 2013/0145124 | A1 | 6/2013 | Qiu et al. |
| 2014/0280420 | A1 | 9/2014 | Khan |
| 2015/0058389 | A1 | 2/2015 | Blomgren et al. |
| 2015/0121043 | A1 | 4/2015 | Lee et al. |
| 2016/0291974 | A1 | 10/2016 | Lingam et al. |
| 2016/0292127 | A1 | 10/2016 | Lingam et al. |
| 2017/0060586 | A1 | 3/2017 | Lingam et al. |
| 2018/0018298 | A1 | 1/2018 | Lingam et al. |

OTHER PUBLICATIONS

Plant et al., "MSP432 Microcontrollers: Bringing High Performance to Low-Power Applications", Texas Instruments, Mar. 2015, 11 pgs.

International Search Report and Written Opinion, PCT/US2017/067030, dated Apr. 5, 2018 (7 pages).

Intel, "IA-64 Application Developer's Architecture Guide," May 1999, pp. 7: 154-158; C:16, 18-19, 23 (10 pages).

Hewlett Packard, "PA-RISC 2.0", 1995, pp. 2:18, 7:60, 62 (5 pages).

Texas Instruments, "The MSP430 Hardware Multiplier—Function and Applications," Application Report SLAA042, Apr. 1999 (34 pages).

SGS-Thomson Microelectronics, "D950-Core: 16-Bit Fixed Point Digital Signal Processor (DSP) Core", Sep. 4, 1997 (89 pages).

* cited by examiner

FIG. 5
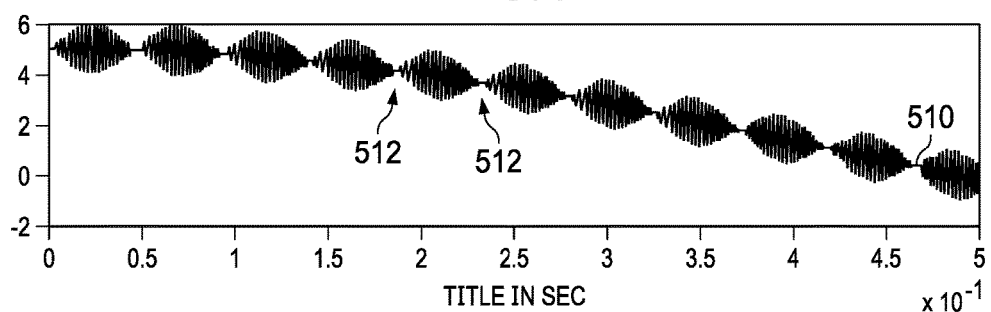
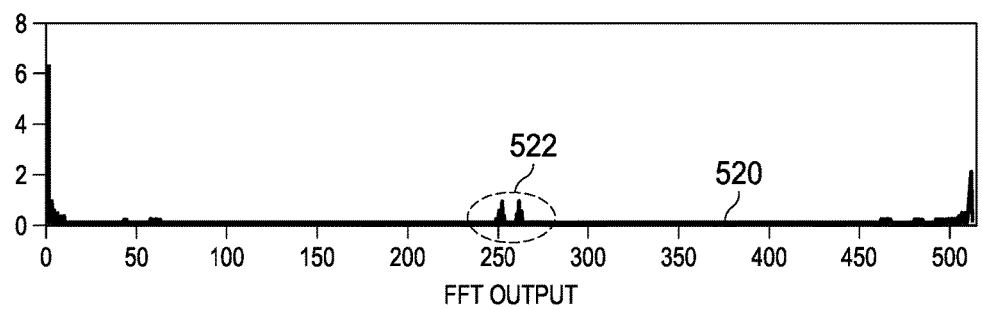
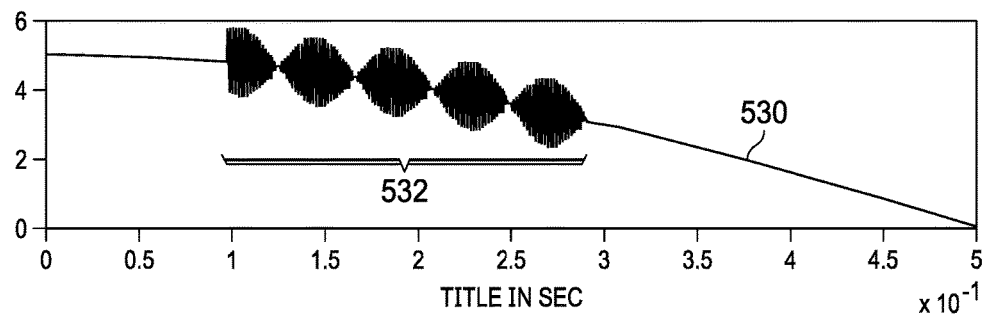
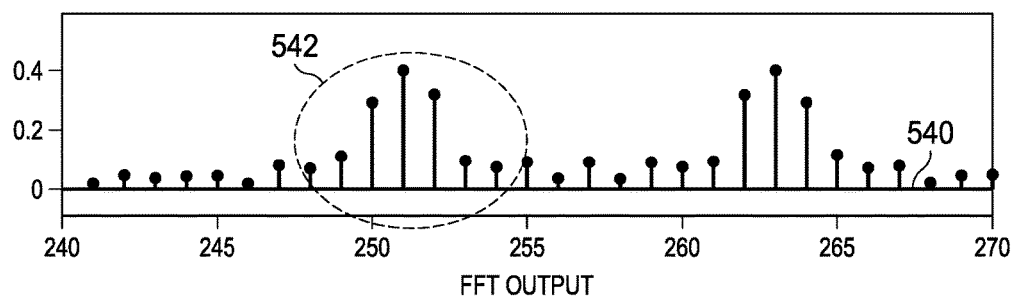

LINE FAULT SIGNATURE ANALYSIS

CROSS-REFERENCE TO RELATED APPLICATION

This application claims the benefit of U.S. Provisional Patent Application No. 62/435,621, filed Dec. 16, 2016, which is incorporated herein by reference in its entirety and for all purposes.

BACKGROUND

Electrical conductors such as wiring and/or cabling carry electrical energy and are arranged for powering electrical circuits and systems. Failures in the arrangement of the conductors (such as improper contacts, breaks or gaps in the conductor elements, and short circuits) can lead to disruptions in the power carried by the electrical conductors. Such disruptions can include faults (such as transient faults and arc faults), which can disrupt and/or destroy the proper operation of the electrical circuits and systems being powered. The arc faults and transient faults both include high-frequency content superimposed over the fundamental periodic waveform of the original power signal. However, determining the frequency content of the power signal using frequency domain analysis can be power and time intensive.

SUMMARY

In described examples, a time-domain analyzer is arranged to generate an indication of a number of high-frequency events of an electrical monitor signal that includes a fundamental periodic frequency. The high-frequency events include frequencies higher than the fundamental periodic frequency. A frequency-domain analyzer is arranged to generate frequency band information in response to frequencies of the electrical monitor signal that are higher than the fundamental periodic frequency. A fault detector is arranged to monitor the indication of the number of high-frequency events and the generated frequency band information, and to generate a fault flag in response to the monitored indication of the number of high-frequency events and the generated frequency band information.

BRIEF DESCRIPTION OF THE DRAWINGS

FIG. 5 is a waveform diagram of example FFT frequency-domain processing of analog-to-digital converter data of an example line fault signature analyzer.

DETAILED DESCRIPTION

Figure 1:
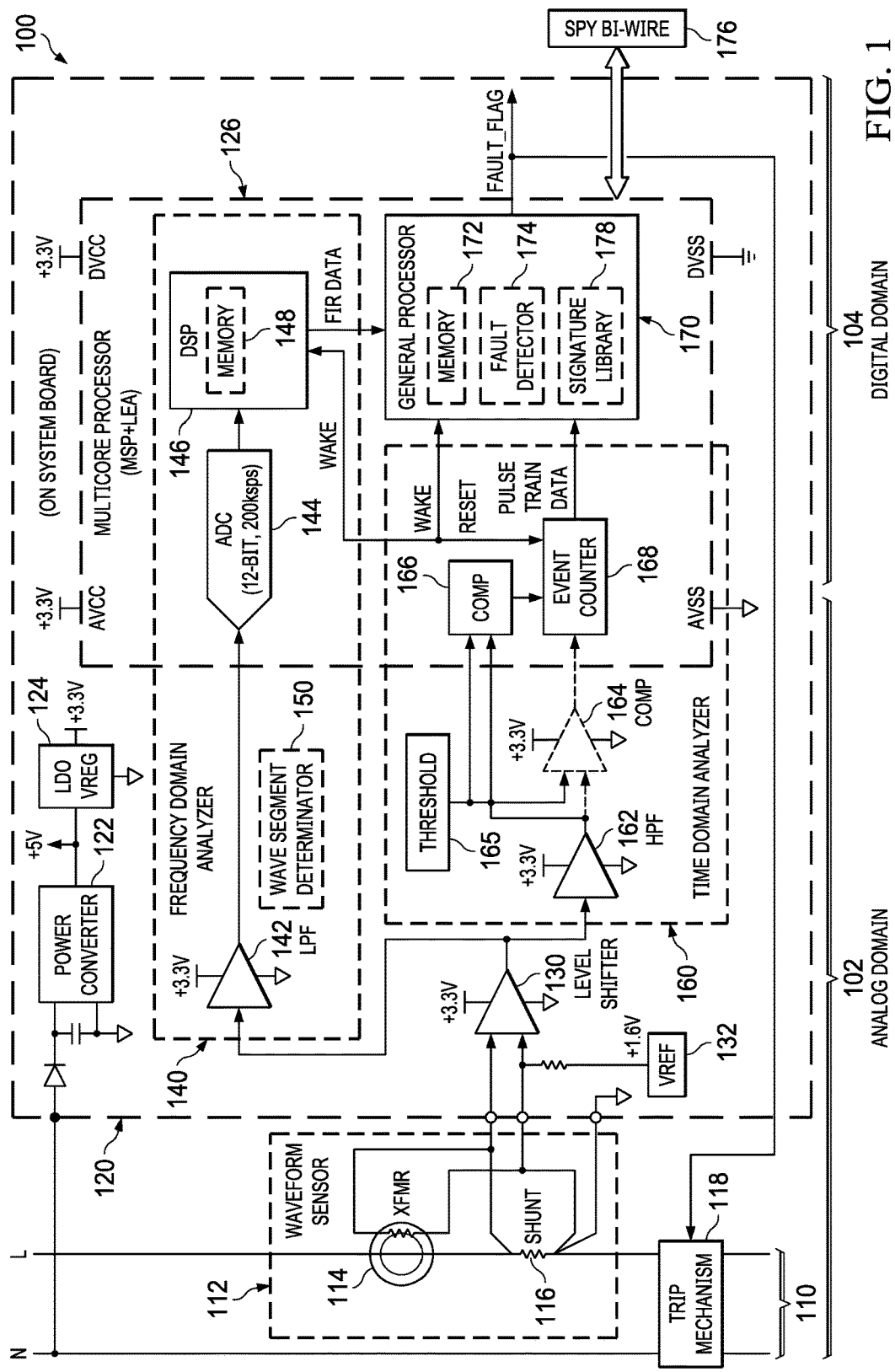
FIG. 1 is a block diagram of an example line fault signature analyzer.

In this description: (a) the term "portion" can include an entire portion or a portion that is less than the entire portion; and (b) the term "noise" can include a signal disturbances resulting from and/or for indicating arcing or other transients occurring during a fault condition.

Described herein are efficient techniques and circuits for monitoring an electrical signal. For example, an alternating current (AC) electrical signal (and the conduit thereof) is subject to conditions that can result in faults, such as arc and transient faults. A sensor can generate a monitor electrical signal for monitoring the electrical signal. The monitor electrical signal can be analyzed in the time and/or frequency domain to determine whether the received electrical signal indicates a fault condition. The fault condition can be indicated by high-frequency content superimposed over (e.g., injected onto, or otherwise distort) an originally generated signal. The frequency content in the received electrical signal can be determined in response to data captured by an analog-to-digital converter (ADC). Time domain information of captured data can be converted into frequency domain information in response to real-time finite-impulse-response (FIR) filtering or fast Fourier transforms (FFT).

The time-to-frequency domain conversion generates frequency analysis data from which specific frequency content in the signal can be detected by a low power arithmetic processor such as a low energy accelerator (LEA) and/or a digital signal processor (DSP). The LEA/DSP can be included in a heterogeneous multicore processor, which can also include a general purpose processor, such as a mixed signal processor (MSP). The LEA includes a low-power mode and can also be quickly placed into a sleep mode or quickly "awakened." The MSP can also include similar power-saving features.

In an example, a fault signature analyzer includes a frequency-domain analyzer and a time-domain analyzer. In the example described hereinbelow, the frequency-domain analyzer (e.g., which can include an LEA operating in a low-power mode) generally dissipates less power than the general processor of the time-domain analyzer. The frequency-domain analyzer can evaluate the received electrical signal to determine whether frequencies indicative of a fault exist. The frequency domain analyzer can perform such an evaluation multiple times during the period of a period of a fundamental frequency waveform of the monitored signal. Accordingly, the frequency domain analyzer can pinpoint the occurrence of a fault indication to a specific fraction (e.g., time-slice, or "wave segment") of the fundamental frequency waveform.

When an fault indication is detected (e.g., by detecting the presence of sufficient energy in selected frequency bands during a specific wave segment), a "wake" signal can optionally be asserted, by which the processor of the time-domain analyzer is activated. The processor of the time-domain analyzer (when so activated) is arranged to compare time-domain events with the frequency domain information and the wave segment number to determine whether the fault flag should be asserted. At the end of the active period, the processer of the time-domain analyzer can be directed to enter a sleep or low-power mode, which can save power otherwise expended by a continuously active processor. To save further amounts of power, the processor of the frequency-domain analyzer can optionally be activated only during a portion of each wave segment and/or only during specific wave segments. The specific wave segments can be selected to include wave segments proximate (described hereinbelow) to a zero crossing of the fundamental frequency waveform of the monitored signal.

In an example, portions of the time-domain analyzer in the frequency-domain analyzer can be implemented by a general processor (e.g., MSP) of the multicore processor. The multicore processor can include a power-intensive portion (e.g., general processor) and a power-conservative portion (e.g., LEA). As described herein, the power-intensive portion of the multicore processor (which can include a general processor) can optionally be activated and deactivated (e.g., moved from one power mode to another) in response to signals generated by the power-conservative portion (which can include an integrated low energy accelerator math engine/general processor and an ADC). In the example, the LEA can assert a "wake" signal in response to detecting a level in a frequency band that exceeds a threshold trigger.

In operation, waveform information of the received electrical signal is captured (e.g., digitized) by the ADC (which can be integrated into the substrate of the multicore processor). The captured waveform information is then transferred to (e.g., saved in) a shared memory (e.g., static or dynamic random access memory) located on and/or off of the multicore processor (e.g., the multicore processor substrate). The power-conservative portion of the multicore processor includes circuitry (e.g., a DSP and/or LEA) for executing FIR filtering (or fast Fourier transforms) on sampled sets of the captured waveform information. Each sampled set is associated with a wave segment number, such that the temporal location of the indications of a fault can be determined and evaluated on a sub-fundamental time period basis.

Transfer of signal information to and from memory to the co-processor of the power-intensive portion of the MSP can be performed at relatively high speeds in response to the "wake" signal. For example, the signal information includes: captured waveform data (e.g., which can be transferred to the DSP via a data bus); and frequency analysis data (e.g., which can be transferred from the DSP to memory via the data bus). The various memories described herein can be accessed using implement direct-memory-access (DMA) techniques to reduce data transfer time of data for processing.

In an example described herein, the captured waveform data is transferred to the DSP at relatively high data rates (e.g., around 200,000 samples per second). The frequency-domain analyzer executes a FIR operation on the captured waveform data in real-time (e.g., on an on-demand basis). The results of the FIR operation (e.g., the frequency analysis data, which can include the energy of specific frequency bands or "bins") is stored in memory for further analysis. The stored frequency analysis data can be further analyzed (e.g., by a general processor) to determine whether the frequency analysis data includes an indication of the presence or relative absence of certain frequency components, which can indicate a fault condition.

In an example described herein, the time-domain analyzer is arranged to determine higher frequency content of the received electrical signal. Such an arrangement saves power because the higher frequency content of the received electrical signal can be determined during the time when the portions of the frequency-domain analyzer are deactivated. The determination of a higher frequency content can increment a counter, such that the "wake" signal can be asserted in response to a count value of the counter. The counter can be implemented using discrete logic circuits to save power, such that counting can be performed when the general purpose processor is deactivated. The general purpose processor can be activated in response to the "wake" signal, such that the energy content of at least one selected frequency band of the received electrical signal can be evaluated.

FIG. 1 is a block diagram of an example line fault signature analyzer. The analyzer 100 generally includes: a waveform sensor 112 (e.g., which is arranged to generate an electrical monitor signal for indicating the amplitude of a current carried by a power line 110); and a line fault signature analyzer system 120 (e.g., which includes components arranged to analyze the electrical monitor signal to determine potential fault conditions associated with the power line 110).

The waveform sensor 112 is usually arranged in a location remote from the system 120. For example, the waveform sensor 112 can be located adjacent to the power line 110 such that sensors of the waveform sensor 112 can generate waveforms in response to a power signal conveyed through the power line 110. The waveform sensor 112 can include either or both of a current transformer (XFMR) 114 and a series shunt resistor 116. The current transformer 114 is arranged to inductively couple power from the power line 110 and to generate a time-variant voltage indicating the change in the current of the power line 110. The series shunt resistor 116 is arranged to generate a voltage in response to the current of the power line 110.

The power line 110 includes a first conductor "line" (L) and a second conductor "neutral" (N). During non-fault conditions, an alternating current flowing through the first conductor L is equal to and opposite in direction from the current flowing through the second conductor N. During fault conditions (e.g., arc faults and transient faults), the fundamental sinusoidal waveform of the alternating current becomes distorted with high-frequency energy. The high frequency energy indicates disruptions in power conveyed by the power line 110. Such disruptions can be harmful.

To reduce damages potentially resulting from the disruptions in power, the electrical monitor signal (e.g. which is generated by the waveform sensor 112 and includes high-frequency information introduced by fault conditions) is coupled to the line fault signature analyzer system 120. In response, subsystems of the line fault signature analyzer system 120 analyze the received electrical monitor signal to determine the presence of high-frequency information indicative of fault conditions in the power line 110.

In an example, electrical insulation of the power line 110 can be damaged, such that a voltage arc or other transient fault occurs that disrupts the sinusoidal waveform presented at a power line frequency (e.g., 60 or 50 Hz) of the power line signal. The voltage arcing or other transient faults introduce high-frequency content into the line power. The waveform sensor 112 generates the electrical monitor signal, such that the electrical monitor signal includes high-frequency information indicating the introduced high-frequency energy. Sub-systems of the line fault signature analyzer system 120 can detect the included high-frequency information and can assert a fault flag (e.g., to indicate that the trip mechanism 118 should be "tripped" to break an electrical connection) in response to the presence of high-frequency information indicative of fault conditions in the power line 110.

The power line 110 can provide power for powering the line fault signature analyzer system 120. For example, a power converter 122 of the line fault signature analyzer system 120 is coupled to receive power from the "N" conductor of the power line 110 and to generate a 5-volt output in response. The 5-volt output is coupled to an input of a low dropout voltage regulator (LDO VREG) 124, which is arranged to generate a 3.3-volt output (e.g., VCC, which is suitable for powering low-voltage circuitry). A second low dropout voltage regulator can be included, such that the first low dropout voltage regulator can be coupled to generate an analog VCC (AVCC), and such that the second low dropout voltage regulator can be coupled to generate a digital VCC (DVCC). Analog grounds (AVSS) and digital grounds (DVSS) can be coupled to the "L" conductor of the power line 110, such that current received from the "N" conductor of the power line 110 is returned to the "L" conductor of the power line 110.

As introduced hereinabove, the waveform sensor 112 can include either or both of a current transformer (XFMR) 114 and a series shunt resistor 116. The current transformer 114 (if present) and the series shunt resistor 116 (if present) each includes first and second outputs (e.g., "ends" of a differential signal), coupled respectively to first and second inputs of level shifter 130. The second input of the level shifter 130 is resistively coupled to a voltage reference 132. The level shifter 130 is arranged to level-shift the electrical monitor signal, such that oscillating waveforms include a "zero" value (e.g., which is a virtual ground, an average value, or intermediate value of 1.6 volts) half-way between the VCC and ground potentials. Accordingly, the signal range of the level-shifted electrical monitor signal is optimized for circuitry operating in response to 3.3-volt operating voltages.

The level-shifted electrical monitor signal is coupled to an input of the frequency-domain analyzer 140, and is coupled to an input of the time-domain analyzer 160. Generally, the frequency-domain analyzer 140 is arranged to evaluate lower frequency information of the level-shifted electrical monitor signal, whereas the time-domain analyzer 160 is arranged to evaluate higher frequency information of the level-shifted electrical monitor signal.

The frequency-domain analyzer 140 includes: a low-pass filter (LPF) 142; an analog-to-digital converter (ADC) 144; a digital signal processor (DSP) 146, which includes closely-coupled memory 148 that can be accessed by the ADC 144 and external processors and devices; and a wave segment determinator 150.

The low-pass filter 142 is arranged to low-pass filter the level-shifted electrical monitor signal and to generate a low-frequency content electrical monitor signal. The low-frequency content electrical monitor signal is coupled to an input of the ADC 144 for digitizing. Additionally, low-pass filtering the level-shifted electrical monitor signal "anti-aliases" the input signal to be digitized by the ADC 144, such that the Nyquist sampling theorem is not violated.

ADC 144 is arranged to digitize the low-frequency content electrical monitor signal. In an example, the ADC 144 generates 12-bit samples at the sample rate of 200,000 samples per second. The ADC 144 is arranged to stream (in parallel or serially) the output samples for storage in the memory 148 of the DSP 146. Accordingly, the stream of output samples of the ADC 144 is a low-frequency content electrical monitor (e.g., digital) signal. The output samples can be streamed in real-time, such that low frequency information can be extracted and processed by the DSP 146 with reduced latency (e.g., such that faults can be detected in less a half-cycle of the line frequency).

The wave segment determinator 150 is coupled to receive the low-frequency content electrical monitor (e.g., analog) signal. As described herein, the arcing and transient faults tend to occur during periods of time associated with zero crossings of the sinusoidal waveform of the line power. The wave segment determinator 150 evaluates the low-frequency content electrical monitor signal to determine an instantaneous phase angle of the periodic waveform of the fundamental frequency (e.g., line frequency). For example, the instantaneous phase angle of the periodic waveform of the fundamental frequency can be determined in response to a determination of a zero crossing and an output of a timer (e.g., clocked counter), such that the number of high-frequency events and the frequency band information generated by the DSP 146 are correlated with a time period (e.g., associated with at least one wave segment). Accordingly, a waveform segment can be a time period less than a half cycle of the fundament periodic frequency and can be time-aligned proximate to a zero crossing of the electrical monitor signal.

If the periodic waveform of the fundamental frequency of the low-frequency content electrical monitor signal is a sinusoidal waveform divided into eight segments, zero crossings occur adjacent to the first, fourth, fifth, and eighth segments of the periodic waveform of the fundamental frequency. If an odd number of wave segments is used to divide the periodic waveform, the zero crossing can occur during a wave segment. Wave segments adjacent to or including a zero crossing can be described as "proximate" to the zero crossing. (The segmentation is described hereinbelow with respect to at least FIG. 2, FIG. 6, and FIG. 8.)

To save power, the DSP 146 can be activated or deactivated in response to samples being acquired from the wave segments adjacent to or including the zero-crossings, as well as potentially being activated or deactivated in response to high-frequency information extracted from the level-shifted electrical monitor signal by the time-domain analyzer 160. For example, the DSP can be activated each wave segment for a period of time (e.g., less than a period of a wave segment) that is sufficient to extract frequency information from the ADC samples. In another example, the DSP can be activated only during wave segments proximate to a zero crossing.

The time-domain analyzer 160 includes a high-pass filter (HPF) 162, a comparator (COMP) 164 or 166, and an event counter 168. In an example, the time-domain analyzer 160 is arranged to evaluate high-frequency information of the level-shifted electrical monitor signal by counting high-frequency events that occur in the level-shifted electrical monitor signal during a given wave segment.

The high-pass filter 162 is arranged to high-pass filter the level-shifted electrical monitor signal and to generate a high-frequency content electrical monitor signal. The high-frequency content electrical monitor signal is coupled to an input of a computer, such as the comparator 164 or the comparator 166. In one example, the comparator 166 is on the same substrate as a multicore processor 126, and can be coupled to process the high-frequency content electrical monitor signal (e.g., at design time or configuration time) when the comparator 166 includes sufficient operational characteristics. In another example, an "external" (e.g., external to the substrate of the multicore processor 126) comparator 164 can be coupled to process the high-frequency content electrical monitor signal.

The comparator 166 (or the comparator 164) is arranged to compare the high-frequency content electrical monitor signal to a voltage reference (such as threshold 165). The voltage reference can be a digitally controlled analog voltage, such that a programmable threshold can be specified for determining the presence of an event. For example, the high frequency information can be indicated, for example, as voltage spikes or transients (such as shown input signal 601 of FIG. 6). When high-frequency content electrical monitor signal exceeds the programmable threshold, the comparator 166 (or the comparator 164) toggles the comparator output high, and when the high-frequency content electrical monitor signal falls below the programmable threshold, the comparator 166 (or the comparator 164) toggles low.

The event counter 168 is arranged to count pulses generated by the comparator 166 (and/or the comparator 164). For example, the event counter 168 can be reset in response to a determination (e.g., by the wave segment determinator 150 or the DSP 146) that a phase angle of the electrical monitor signal is proximate to a wave segment boundary. Accordingly, events occurring within a wave segment can be counted. In an embodiment, the DSP 146 can be activated in response to the number of the counted events exceeding an event threshold. In an embodiment, the DSP 146 can be activated in response to the number of counted events exceeding an event threshold during a wave segment that is proximate to a zero crossing of the electrical monitor signal. In an example, event counter 168 can maintain a log of the claims at which each event occurred, such that the time within a period of a wave segment can be determined with a high degree of specificity. The event counter can be arranged to provide an indication of the number of high-frequency events as a terminal count or a value indicating the energy level of the high-frequency content that exceeds the threshold 165 during a wave segment.

Accordingly, portions of the time-domain analyzer 160 (such as lower power hardware discrete logic circuits) can save power by activating the DSP only during wave segments that have (e.g., high-frequency) events occurring, and/or only during the wave segments proximate to a zero crossing (which is when arcing faults are more likely to occur). If so activated, the DSP 146 can extract frequency information from sampled data from a selected wave segment (e.g., indicated by the number of high-frequency events occurring therein).

The general processor 170 includes memory 172 and executable instructions for implementing the fault detector 174. To save power, the general processor 170 can be activated during selected times. For example, the general processor 170 can be activated in response to the activation of the DSP 146. The general processor 170 can also be activated in time ("just in time") for processing DSP 146 results (e.g., which saves power). In general, the processor 170 can be activated in response to a determination of a transition to a next wave segment or the transition to a particular wave segment (such as a wave segment proximate to a zero crossing).

The general processor 170 is arranged to evaluate the number of high-frequency events associated with a wave segment, the wave segment number (e.g., the ordinality of a particular wave segment of the fundamental period), and frequency information (e.g., frequency band information) determined by the DSP 146. In response to the determination, the general processor can generate a real-time candidate fault signature. The candidate fault signature can be compared with parameters for signatures of known faults (e.g., stored in signature library 178) to determine the likelihood that the candidate fault signature is indeed a fault. Because the fault likelihood is determined in response to a wave segment (e.g., which indicates in what portion of a wave a signature event occurs), the probability of a false positives (e.g., determining a fault that doesn't exist) and false negatives (e.g., determining that no fault exists when a fault does indeed exist) are reduced. Accordingly, methods, systems, and apparatus are described herein for increasing accuracies of fault determinations and conserving power.

The analyzer 100 can be arranged as a sub-system of a larger system. For example, the general processor 170 includes an interface by which FIR data (described hereinbelow), pulse train data (described hereinbelow), and a fault flag are used to protect external devices. Further, the FIR data and the pulse train data can be evaluated by external systems for signature analysis to determine what actions to take (e.g., decoupling power) in response to the assertion of the fault flag. The "Spy-Bi-Wire" is a two-wire test interface 176, which is capable of emulating Joint Test Action Group (JTAG) commands for setting and reading internal registers of the analyzer 100. Also, the memory 172 of the general processor 170 can be updated (e.g., after deployment) to change (or load) a signature library 178, such that new signatures can be used to reduce false positives (e.g., to ignore false-positive signatures resulting from recently introduced technologies such as light-emitting-diode-based lighting).

Figure 2:
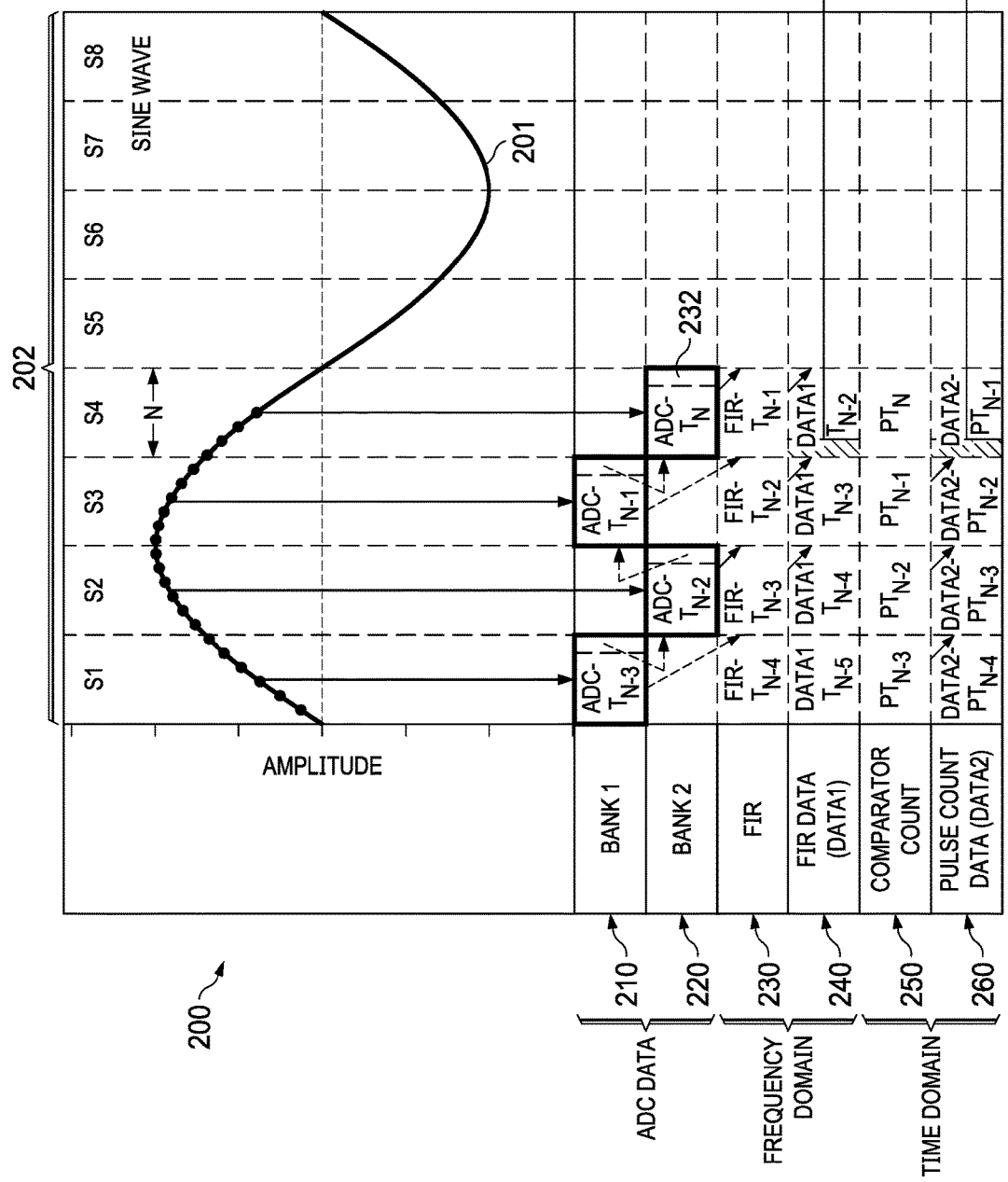
FIG. 2 is a data flow diagram of example frequency-domain and time-domain processing of data derived from an electrical monitor signal of an example line fault signature analyzer.

FIG. 2 is a data flow diagram of example frequency-domain and time-domain processing of data derived from an electrical monitor signal of an example line fault signature analyzer. Flow diagram 200 includes a representation 212 of segmentation of a periodic waveform 201. The periodic waveform 201 can represent sinusoidal voltage or current in a monitored power line, such as power line 110 described hereinabove. The periodic waveform 201 is usually not ideal and can include noise and other disturbances (such as high-frequency information resulting from a line fault). The periodic waveform 201 is divided into eight equal wave segments, such as S1, S2, S3, S4, S5, S6, S7, and S8. More or less than eight segments can be used to divide the periodic waveform 201.

The periodic waveform 201 includes zero-crossings. A wave segment is proximate to a zero crossing when the wave segment is adjacent to or includes a zero crossing. For example, wave segments proximate to a zero crossing include wave segments S1, S4, S5, and S8. The periodic waveform 201 is shown as a sine wave, although other periodic signals can be used. In addition, the first wave segment (e.g., S1) need not be proximate to a zero crossing.

An analog-to-digital converter (such as ADC 144) is arranged to generate a samples set 220 during each wave segment. The analog-to-digital converter can be arranged to generate samples continuously or to generate samples on-demand, such as for a wave segment proximate to a zero crossing. Alternating banks of memory bank 1 (210) and bank 2 (210) are used to store sets of samples derived from the periodic waveform 201. Assigning of memory banks and memory locations, as well as starting, stopping, grouping, and FIR filter processing of samples can be made in response to a phase-angle-related determination by a wave segment determinator (such as wave segment determinator 150).

For example, the analog-to-digital converter is arranged to store ADC data for each wave segment: a sample set acquired during the wave segment S1 is stored in a first location of a first bank of memory 210 as samples set ADC-$T_{n-3}$ (where n=4, which denotes the wave segment S4, which is proximate to a zero crossing); a sample set acquired during the wave segment S2 is stored in a first location of a second bank of memory 220 as samples set ADC-$T_{n-2}$; a sample set acquired during the wave segment S3 is stored in a second location of the first bank of memory 210 as samples set ADC-$T_{n-1}$; and a sample set acquired during the wave segment S4 is stored in a second location of a second bank of memory 220 as samples set ADC-$T_n$.

Frequency domain operations are accomplished using memories 230 and 240. Memory 230 shows an ordering of data for successive wave segment-aligned FIR filtering operations. For example, ADC data from banks of memory 210 and 220 are moved to memory 230 for access by a DSP to perform FIR filter operations (or FFT operations): the sample set 210 acquired during the wave segment S1 is stored during wave segment S2 in memory 230 (as FIR-$T_{N-3}$); the sample set 220 acquired during the wave segment S2 is stored during wave segment S3 in memory 230 (as FIR-$T_{N-2}$); the sample set 210 acquired during the wave segment S3 is stored during wave segment S4 in memory 230 (as FIR-$T_{N-1}$); and the sample set 220 acquired during the wave segment S4 would be stored during wave segment S5 in memory 230 (as FIR-$T_N$).

The DSP (such as DSP 146) is arranged to selectively perform FIR filter operations on selected samples sets 230: the sample set 220 stored during the wave segment S2 is processed as FIR operation FIR-$T_{N-2}$ and stored in memory 240 during wave segment S3 (as DATA1-$T_{N-3}$); and the sample set 220 stored during the wave segment S3 is processed as FIR operation FIR-$T_{N-1}$ and stored in memory 240 during wave segment S4 (as DATA1-$T_{N-2}$).

The FIR filter implemented by the DSP (e.g., by executing instructions stored in memory 148) usually includes at least two taps and can include a hundred or more taps. The number of taps can be determined by filter parameters, which can be a bandpass filter as described below with reference to FIG. 3. The bandpass filter effectively transforms the time-domain information (of the sample sets) into frequency-domain information. The filter parameters are set in accordance with the width of a frequency band, such that the DSP can search for and/or evaluate frequency information in the sampled electrical monitor signal. The frequency information processed by the DSP is sub-Nyquist frequency and lower than the frequencies passed by the high-pass filter 162, for example.

In order to perform an example FIR operation for all samples of a sample set, a number of consecutive samples (of the last samples acquired during a preceding wave segment: "N−1") equal to the number of filter taps (e.g., tap length 232) is prepended to the sample set of a wave segment currently being processed (e.g., "N"). The prepended samples can be used to "prime the filter" by clocking the prepended samples by a number of clocks equal to the number of taps. Accordingly, the entire sample set for a wave segment can be processed without losing information. Further memory space can be conserved by reusing memory locations after the FIR-output information is evaluated (e.g., by a general processor, such as general processor 170).

As described herein, the DSP can be awakened (or otherwise activated) to process the frequency domain information stored in memory 230 in response to time domain information (such as a count exceeding a threshold during any wave segment, even before a terminal count is reached at the end of a wave segment). Accordingly, power can be saved (for example) by only processing the frequency domain information stored in memory 240 when a fault event is indicated. Further, the DSP can be activated before the start of a next wave segment, which mitigates or eliminates processing time encountered in activating the DSP.

The frequency domain information stored in memory 240 is accessed and processed by the general processor 290 (which is a processor such as general processor 170) to determine whether a fault condition is indicated. The determination is made in response to fault signature data stored in the signature library 178, the frequency domain information stored in memory 240, and time domain information (described hereinbelow) stored in memory 260.

The time domain information includes the number of high-frequency events counted by the event counter 168 (where the memory of the event counter is memory 250). For example, the pulse count (e.g., terminal count) of a pulse train of high-frequency events $PT_{N-3}$ encountered in wave segment S1 is stored in memory 260 during wave segment S2 as DATA2-$PT_{N-3}$, the terminal count of a pulse train of high-frequency events $PT_{N-2}$ encountered in wave segment S2 is stored in memory 260 during wave segment S3 as DATA2-$PT_{N-2}$, and the terminal count of a pulse train of high-frequency events $PT_{N-1}$ encountered in wave segment S3 is stored in memory 260 during wave segment S4 as DATA2-$PT_{N-1}$.

In an example fault determination process for determining whether a fault condition is indicated for wave segment S2, the general processor 290 accesses the frequency domain information stored in memory 240 during wave segment S4, and accesses the time-domain information stored in memory 260 during wave segment S4 (or potentially earlier, e.g., by reading memory 250). Accordingly, a determination as to whether a fault condition is indicated can be determined with a latency of a total duration of around three wave segments, which is less than the period of a half-cycle of the line frequency.

The fault determination process can be executed synchronously or asynchronously. In a synchronous example, the FIR data (DATA1) and the pulse count data (DATA2) are transferred together as DATA1-$T_{N-2}$ and DATA2-$PT_{N-2}$ can be transferred together. In an asynchronous example, the time domain analyzer can monitor an active count (e.g., while the general processor 290 is inactive) and directly activate the DSP as well as activate the general processor 290 directly (or indirectly as a consequence of the DSP detecting fault energy in a frequency band, upon which the DSP can activate the general processor 290).

Figure 3:
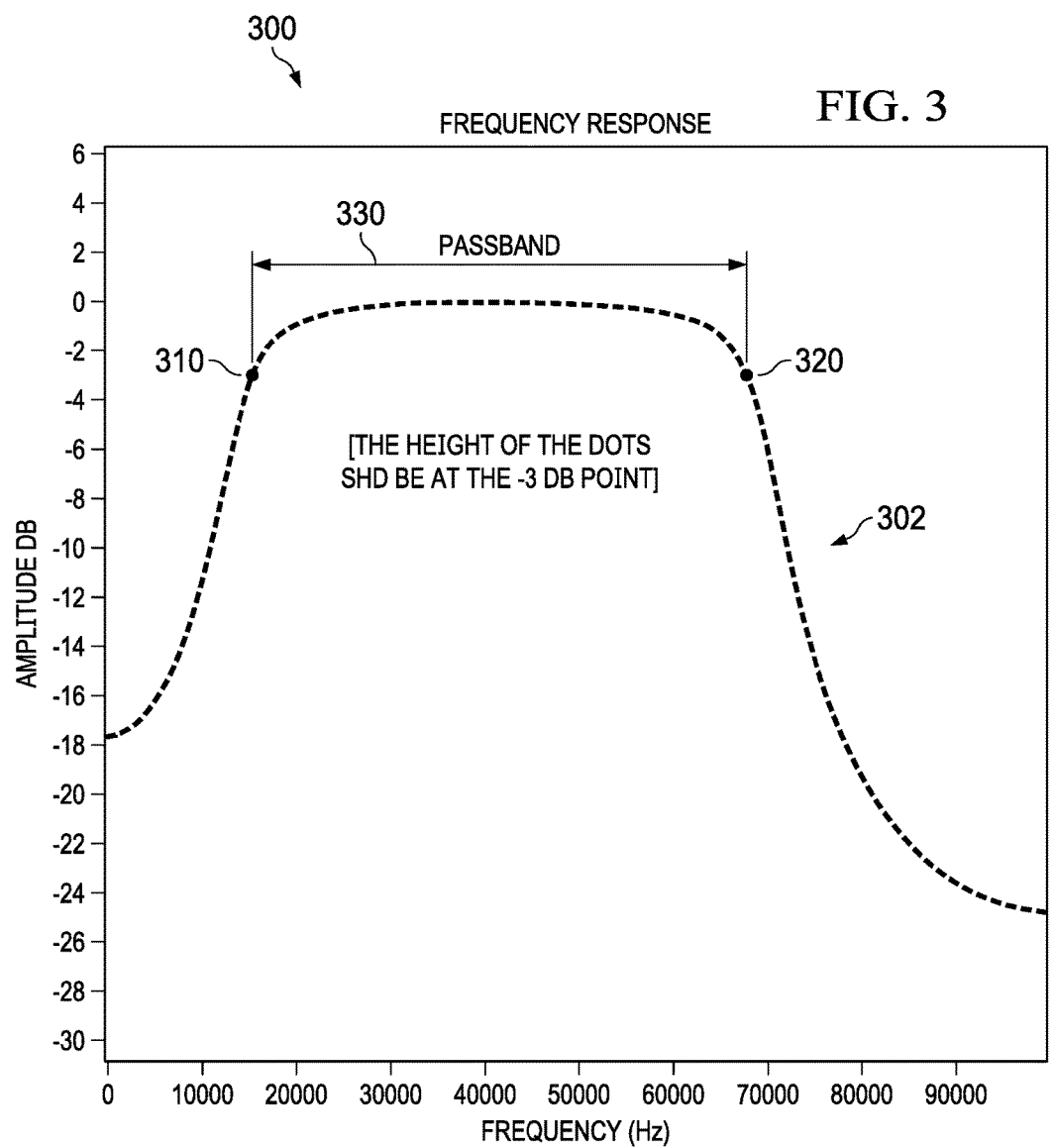
FIG. 3 is a frequency response diagram showing parameters of an example bandpass filter of an example frequency-domain analyzer.

FIG. 3 is a frequency response diagram showing parameters of an example bandpass filter of an example frequency-domain analyzer 140. For example, a DSP (such as DSP 146) can be arranged to implement a FIR filter having a frequency response such as the frequency response of the frequency diagram 300. The frequency response diagram 300 includes a frequency response curve 302. The frequency response curve 302 can be characterized by roll-off (e.g., shown by the "skirts" of the frequency response curve 302, and which can be measured in units of dB/octave) and the width of passband 330. The width of the passband spans the frequency range between the −3 dB (decibel) point 310 (at 15 kHz) and the −3 dB point 310 (at 65 kHz). The passband starting frequency and width (or width and stopping frequency) are software-selectable, such that selected electrical frequencies from benign sources of electrical noise can be excluded from the output of a FIR operation. Increasing the number of taps of the FIR filter can increase the steepness of the roll-off.

Figure 4:
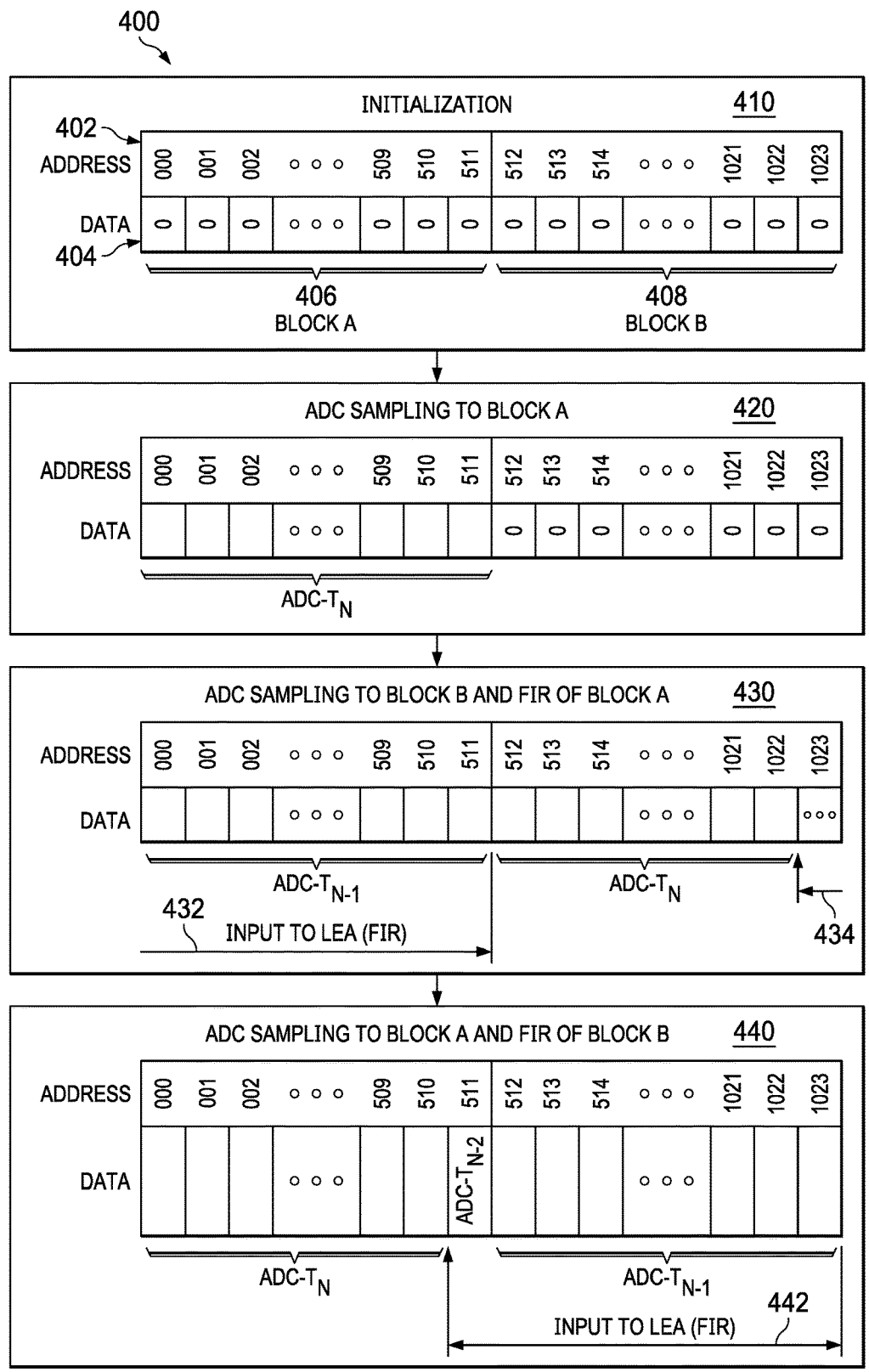
FIG. 4 is a process flow diagram showing example overlapping memory operations of digitally sampled waveform information of an example line fault signature analyzer.

FIG. 4 is a process flow diagram showing example overlapping memory operations of digitally sampled waveform information of an example line fault signature analyzer. For example, an analog-to-digital converter (such as ADC 144) and a DSP (such as DSP 146) can be arranged to share memory (such as memory 148) in accordance with the process flow 400. The process flow 400 begins in operation 410.

In operation 410, the shared memory is initialized. For example, the shared memory is organized as first and second memory blocks, such as memory blocks 406 and 408 (e.g., block A and block B). Both memory blocks A and B are independently addressable, such that both block A and block B can be accessed using overlapping and/or simultaneous read and write operations. In the example, a first memory block can be written or read by the ADC independently of the DSP, and the DSP can read from or write to the second memory block independently of the ADC. The address range 402 of block A extends from 0 to 511, whereas the address range 402 of block B extends from 512 to 1023. In operation 410, the data 404 across the memory ranges 402 are initialized with the value of zero (0). Process flow 400 continues with operation 420.

In operation 420, the ADC samples an input waveform during a first wave segment (e.g., $T_N$), and stores the sampled ADC values as data 404 in block A. For example, the ADC successively samples a low-pass filtered (e.g., low-frequency) content electrical monitor signal during a first wave segment and stores the samples successively as data (e.g., ADC-$T_N$) in block A. The successive sampling is aligned with the start and an ending of a selected wave segment, and can be controlled (e.g., aligned) in response to an output from the waveform segment determinator 150. Process flow 400 continues with operation 430.

In operation 430, the ADC samples the input waveform during a second wave segment. The second wave segment is a new $T_N$ (e.g., such that the newly obtained samples in block B are referenced as ADC-$T_N$ and the previously obtained samples are referenced as ADC-$T_{N-1}$). The DSP is arranged to read the ADC-$T_{N-1}$ values 432 stored in block A, to perform a FIR operation on the block A data, and to write the FIR results over the previously stored ADC-$T_{N-1}$ values.

To prepend FIR input data (e.g., for filling the filter taps with relevant data), a sequence 434 of stored ADC values sampled during a wave segment that was sampled before the first wave segment is retrieved by the DSP (e.g., before the previously sampled data is overwritten by new ADC samples obtained during the second wave segment). The DSP is arranged to read the sequence 434 (e.g., at the start of operation 430) such that the old ADC-$T_{N-1}$ samples are read before being replaced (e.g., near the end of operation 430). The overwriting of data by either or both the DSP and the ADC conserves memory space, which also reduces power dissipation. Process flow 400 continues in operation 440.

In operation 440, the ADC samples the input waveform during a third wave segment. The third wave segment is a latest $T_N$, such that the newly obtained samples in block A are referenced as ADC-$T_N$, the previously obtained samples are referenced as ADC-$T_{N-1}$, and the prepended sample set (which for simplicity is shown in reduced form in data location 511) is referenced as ADC-$T_{N-2}$. The DSP is arranged to read the ADC-$T_{N-1}$ and ADC-$T_{N-2}$ values 442 stored in block B, to perform a FIR operation on the block B data (e.g., previously sampled during the second wave segment), and to write the FIR results over the previously stored ADC-$T_{N-1}$. values. To prepend FIR input data (e.g., for filling the filter taps with relevant data), a sequence (e.g., initial portion of 442) of ADC-$T_{N-2}$ values stored before the second wave segment is retrieved by the DSP (e.g., before the previously sampled data is overwritten by new ADC samples obtained during the third wave segment).

In an example process flow 400, the ADC can be: activated in a continuously running state; activated for at least an end portion of each wave segment; or activated for least an end portion of selected wave segments. Such activation helps ensure a sequence 434 is available for filling tap filters in advance of processing of ADC data obtained during a selected wave segment.

FIG. 5 is a waveform diagram of example FFT frequency-domain processing of analog-to-digital converter data of an example line fault signature analyzer. In a first example, waveform diagram 500 shows a content electrical monitor signal 510. The electrical monitor signal 510 is around 12 volts peak-to-peak and includes a portion of a line frequency fundamental periodic waveform as well as frequency-correlated noise (e.g., caused by electrical fault conditions) extending across an entire wave segment. The noise (e.g., shown by excursions of the electrical monitor signal 510 between nodes 512) is around 2 volts peak-to-peak.

A DSP (such as DSP 146) can obtain an input sample set, where the number of samples is the number of samples within a period of the wave segment. The FFT output is shown as curve 520, where the frequency-correlated noise is revealed as energy 522. The energy of the frequency-correlated noise is transformed to the frequency domain, where the energy 522 in the frequency domain is derived from the energy of the noise in the entire sample set.

In a second example, the content electrical monitor signal 530 is also 12 volts peak-to-peak and includes a portion of a line frequency fundamental periodic waveform as well as (e.g., the same) frequency-correlated noise (e.g., caused by electrical fault conditions) that extends across only a smaller portion 532 of the associated wave segment. The noise is also around 2 volts peak-to-peak.

The DSP performs an FFT operation to transform an input sample set into frequency information, where the number of samples is the number of samples within a period of a wave segment. The FFT output is shown as a sample set 540 (which is shown enlarged, as compared against a scale of the curve 520). The frequency-correlated noise of electrical monitor signal 530 is revealed as energy 542.

The energy of the frequency-correlated noise is transformed to the frequency domain, where the energy 522 in the frequency domain is derived from the energy of the noise in the entire sample set. The energy of the frequency-correlated noise of electrical monitor signal 530 is substantially less than the frequency-correlated noise of electrical monitor signal 510 because the frequency-correlated noise of electrical monitor signal 530 extends (e.g., only) across a portion of the frequency-correlated noise of electrical monitor signal 530. The lesser energy is transformed into lower amplitude values. Accordingly, smaller durations of frequency-correlated noise are more difficult to detect using FFT transforms because of the resulting lower amplitude values.

Figure 6:
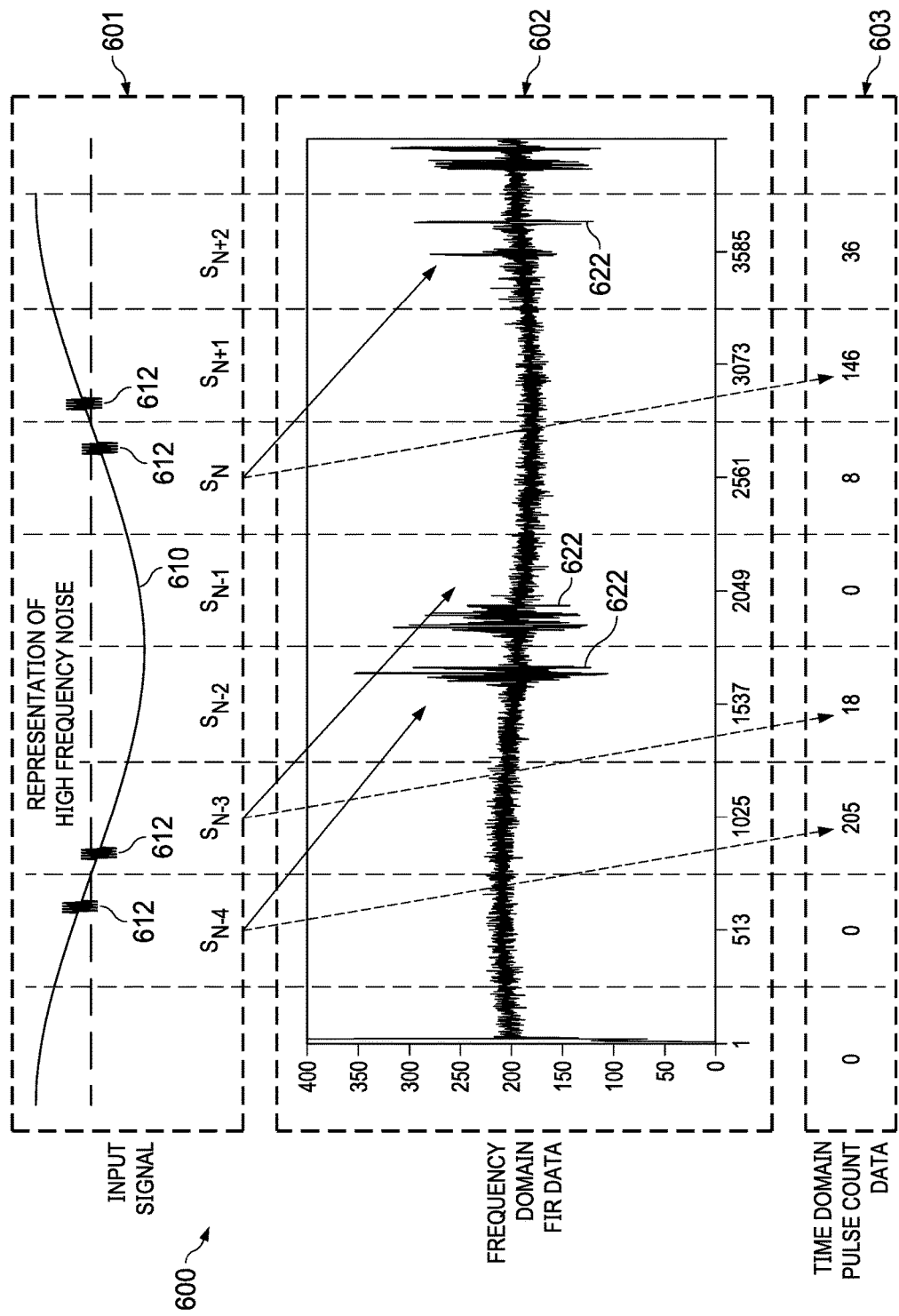
FIG. 6 is a waveform diagram of example fault signal information detected during wave segments of a period of an example fundamental periodic waveform.

FIG. 6 is a waveform diagram of example fault signal information detected during wave segments of a period of an example fundamental periodic waveform. Diagram 600 shows an input signal 601, frequency domain FIR data 602, and time domain pulse count data 603.

The input data 601 is a sinusoidal waveform 610 that demonstrates a correlation of wave samples (e.g., from the input data 601 as sampled by an ADC) with the frequency domain FIR data 602. (The energy of the sinusoidal waveform of in input signal 601 has been reduced in the frequency domain FIR data 602 because the sinusoidal waveform of the input signal 602 has a fundamental frequency falling well below the lower cutoff frequency of the passband filter.)

In accordance with the description hereinabove with respect to FIG. 2, the fundamental period of the input signal 601 can divided into eight segments (e.g., S1 through S8), wherein each sample set is associated with 256+1 (endpoint to endpoint) samples of the low-frequency electrical monitor signal stored by the ADC. Accordingly 4K+1 samples (e.g., endpoint to endpoint) can be stored (memory space can be reused as described hereinabove with respect to FIG. 2 and FIG. 5).

A processor (such as the general processor 170) is arranged to evaluate the (digital) frequency domain FIR data 602. The frequency domain FIR data 602 includes excursions 622. The excursions 622 can be detected by comparing each value of the frequency domain FIR data 602 with an average value of the frequency domain FIR data 602 (e.g., such that the average value is used as a threshold). Additionally, each excursion 622 within a particular wave segment can be correlated with the number of events detected and logged by a time-domain analyzer, such as time-domain analyzer 160.

The processor can correlate frequency-domain information (associated with each excursion 622) with time-domain information (e.g., as counted on a wave-segment basis). The correlation of the frequency-domain information with the time-domain information enhances the probability of properly (and within a time period around two or three wave-segments long) determining the existence of a fault condition. In addition, the input signal 601, frequency domain FIR data 602, and time domain pulse count data 603 are correlated with specific time periods (e.g., that are associated with corresponding wave segments), which can be used to identify fault conditions that occur at or near a zero crossing of the input signal 601.

The processor is configurable as a fault detector in response to executable instructions that are stored in memory. The fault detector is arranged to monitor the presence of the number of high-frequency events and the generated frequency band information, and to generate a flag in response to the monitored indication of the number of high-frequency events and the generated frequency band information.

The time-domain information can be generated by a time-domain analyzer (such as time-domain analyzer 160). The time-domain information can be generated by high-pass filtering the electrical monitor signal and counting pulses generated when the high-frequency information of the electrical monitor signal exceeds a threshold. The pulses counted are associated with events, which can indicate fault conditions.

For example, the input signal 601 indicates events 612 superimposed over the sinusoidal waveform 610. The events occur during wave segments $S_{N-4}$, $S_{N-3}$, $S_N$, and $S_{N+1}$ (which are the wave segments proximate to a zero crossing). The event 612 occurring during wave segment $S_{N-4}$ is detected in the time domain pulse count data 603 (as a terminal count of 205) during wave segment $S_{N-3}$ and is detected (as excursions 622) in the frequency domain FIR data 602 during wave segment $S_{N-2}$. The event 612 occurring during wave segment $S_{N-3}$ is detected in the time domain pulse count data 603 (as a terminal count of 18) during wave segment $S_{N-2}$ and is detected (as excursions 622) in the frequency domain FIR data 602 during wave segment $S_{N-1}$. The event 612 occurring during wave segment $S_N$ is detected in the time domain pulse count data 603 (as a terminal count of 148) during wave segment $S_{N+1}$ and is detected (as excursions 622) in the frequency domain FIR data 602 during wave segment $S_{N+2}$.

The time domain pulse count data 603 stored during wave segment $S_N$ indicates a terminal count of 8 and is indicative of benign noise. The terminal count of 18 is indicative of benign noise because the terminal count of 8 occurs in response to noise occurring during wave segment $S_{N-1}$, which is not proximate to a zero crossing. Also, terminal count of 8 is indicative of benign noise because the terminal count of 18 is a relatively low number. Further, the terminal count of 8 is indicative of benign noise because the terminal count of 18 does not correlate with excursions of energy in the frequency domain FIR data 602. The signature library (such as signature library 178) contains respective thresholds for determining fault conditions for distinguishing between benign conditions and fault conditions in response to comparisons involving proximity to zero crossings, high-frequency energy detected in the time domain, and energy within selected frequency bands.

Figure 7:
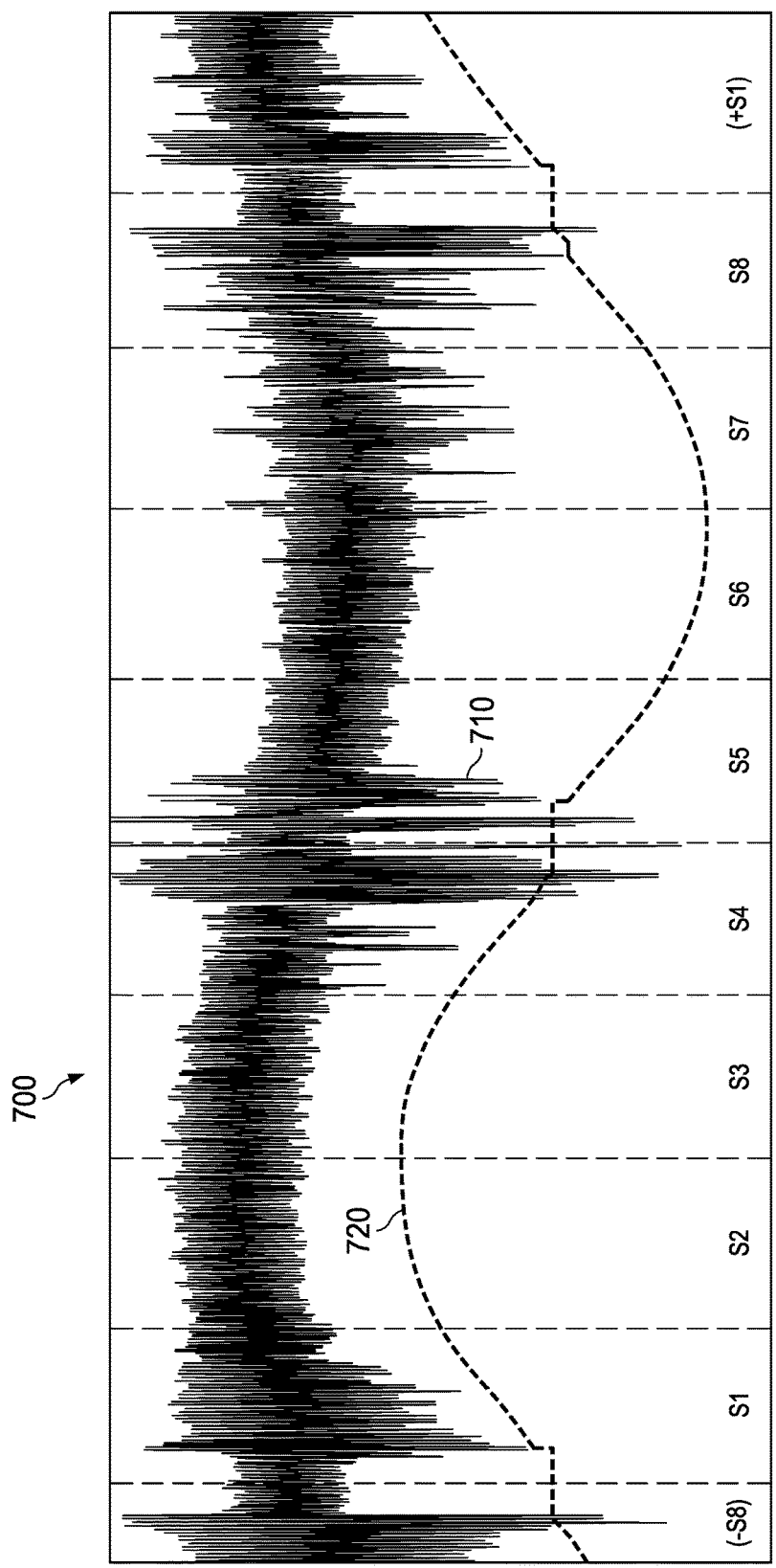
FIG. 7 is a waveform diagram of example fault-induced signal disturbances over wave segments of an example period of a fundamental periodic waveform.

FIG. 7 is a waveform diagram of example fault-induced signal disturbances over wave segments of an example period of a fundamental periodic waveform. Waveform diagram 700 includes a waveform 710 that shows an example electrical monitor signal for indicating power being transmitted across a power line, such as power line 110. As discussed hereinabove, arcing and transient faults tend to occur during periods of time associated with zero crossings of the sinusoidal waveform of the line power. Waveform 710 show disturbances resulting from such faults during waveforms segments S1, S4, S5, and S8.

Signal 720 is an averaged (e.g., boxcar-averaged) signal of the waveform 710. Signal 720 generally shows the underlying sinusoid of the example fundamental periodic waveform. Also, the disturbances caused by arcing and transient faults is shown by discontinuities operating cash or near zero crossings.

Modifications are possible in the described embodiments, and other embodiments are possible, within the scope of the claims.

What is claimed is:

1. An apparatus comprising:
    a time-domain analyzer arranged to generate an indication of a number of high-frequency events of an electrical monitor signal that includes a fundamental periodic frequency, wherein the high-frequency events include frequencies higher than the fundamental periodic frequency, and wherein the high-frequency events are correlated with a correlated time period that is less than a half cycle of the fundamental period;
    a frequency-domain analyzer arranged to generate frequency band information in response to frequencies of the electrical monitor signal that are higher than the fundamental periodic frequency, and wherein the frequency band information is correlated with the correlated time period; and
    a fault detector arranged to monitor the indication of the number of high-frequency events and the generated frequency band information, and to generate a flag in response to the monitored indication of the number of high-frequency events, the generated frequency band information, and the correlated time period.

2. The apparatus of claim 1, comprising a wave segment determinator arranged to determine zero crossings of the electrical monitor signal and to divide the electrical monitor signal into wave segments, and wherein the correlated time period is associated with at least one of the wave segments.

3. The apparatus of claim 1, comprising a signature library that includes thresholds of number of high-frequency events and thresholds of frequency band information for identifying fault conditions, and wherein the monitoring the indication of the number of high-frequency events and the generated frequency band information includes comparing the indication of the number of high-frequency events and the generated frequency band information against the respective thresholds of event and frequency band information for identifying fault conditions.

4. The apparatus of claim 1, wherein the fundamental periodic frequency is a power line frequency of a power line signal, wherein the electrical monitor signal is generated in response to the power line signal.

5. The apparatus of claim 4, wherein the waveform segment is time-aligned proximate to a zero crossing of the electrical monitor signal.

6. The apparatus of claim 1, wherein the fault detector is arranged to monitor the indication of the number of high-frequency events and the generated frequency band information, and to generate the flag in less than a half cycle of the fundamental period after the occurrence of the high-frequency events on the electrical monitor signal.

7. The apparatus of claim 1, wherein a processor of the frequency domain analyzer is arranged to be activated for processing wave segment samples sampled in response to the indication of a number of high-frequency events.

8. The apparatus of claim 7, wherein the processor of the frequency domain analyzer is arranged to be deactivated during a portion of the fundamental periodic frequency electrical monitor signal.

9. The apparatus of claim 8, wherein the fault analyzer includes a general processor capable of being deactivated when the processor of the frequency domain analyzer is executing instructions.

10. The apparatus of claim 7, wherein the processor of the frequency domain analyzer is arranged to FFT the sample set.

11. The apparatus of claim 7, wherein the processor of the frequency domain analyzer is arranged to bandpass filter the sample set.

12. The apparatus of claim 7, wherein the fault detector includes a signature library that includes time-domain and frequency-domain signatures for indicating thresholds for fault conditions of a power line monitored by the electrical monitor signal.

13. The apparatus of claim 1, comprising a sensor arranged to generate the electrical monitor signal in response to fluctuations of a power line signal, wherein the fluctuations of the power signal are generated in response to fault conditions of the power line signal.

14. The apparatus of claim 1, wherein the frequency-domain analyzer includes a processor, wherein the fault detector includes a processor, and wherein the processor of the frequency-domain analyze and the processor of the fault detector are formed on a single substrate.

15. A system comprising:
a time-domain analyzer including a comparator and counter arranged to generate an indication of a number of high-frequency events of an electrical monitor signal that includes a fundamental periodic frequency, wherein the high-frequency events include frequencies higher than the fundamental periodic frequency, and wherein the high-frequency events are correlated with a correlated time period that is less than a half cycle of the fundamental period;
a frequency-domain analyzer including a first processor that is arranged to generate frequency band information in response to frequencies of the electrical monitor signal that are higher than the fundamental periodic frequency, and wherein the frequency band information is correlated with the correlated time period; and
a fault detector including a second processor that is arranged to monitor the indication of the number of high-frequency events and the generated frequency band information, and to generate a flag in response to the monitored indication of the number of high-frequency events, the generated frequency band information, and the correlated time period.

16. The system of claim 15, wherein the first and second processors are formed on the same substrate.

17. The apparatus of claim 15, comprising a wave segment determinator arranged to determine zero crossings of the electrical monitor signal and to divide the electrical monitor signal into wave segments, and wherein the correlated time period is associated with at least one of the wave segments.

18. The apparatus of claim 15, comprising:
a signature library that includes thresholds of number of high-frequency events and thresholds of frequency band information for identifying fault conditions, and wherein the monitoring the indication of the number of high-frequency events and the generated frequency band information includes comparing the indication of the number of high-frequency events and the generated frequency band information against the respective thresholds of event and frequency band information for identifying fault conditions; and
a trip mechanism arranged to break an electrical connection in response to the generated flag.

19. A method comprising:
generating an indication of a number of high-frequency events of an electrical monitor signal that includes a fundamental periodic frequency, wherein the high-frequency events include frequencies higher than the fundamental periodic frequency, and wherein the high-frequency events are correlated with a correlated time period that is less than a half cycle of the fundamental period;
generating frequency band information in response to frequencies of the electrical monitor signal that are higher than the fundamental periodic frequency, and wherein the frequency band information is correlated with the correlated time period;
monitoring the indication of the number of high-frequency events and the generated frequency band information; and
generating a flag in response to the monitored indication of the number of high-frequency events, the generated frequency band information, and the correlated time period.

20. The method of claim 19, comprising comparing the indication of the number of high-frequency events and the generated frequency band information against respective thresholds of event and frequency band information for identifying fault conditions, wherein the respective thresholds of event and frequency band information for identifying fault conditions are stored in a memory accessible by at least one processor configured for comparing the indication of the number of high-frequency events and the generated frequency band information against the respective thresholds of event and frequency band information for identifying fault conditions.

* * * * *